United States Patent [19]

Bessard et al.

[11] 4,169,969
[45] Oct. 2, 1979

[54] APPARATUS FOR DETECTING IN-BAND SIGNALLING SIGNALS

[75] Inventors: Jacques Bessard; Robert Dallemagne; Claude Hannigsberg, all of Paris, France

[73] Assignee: Societe Lignes Telegraphiques et Telephoniques, Paris, France

[21] Appl. No.: 862,160

[22] Filed: Dec. 19, 1977

Related U.S. Application Data

[63] Continuation of Ser. No. 628,844, Nov. 4, 1975, abandoned.

[30] Foreign Application Priority Data

Nov. 21, 1974 [FR] France .................................. 74 38236
Dec. 13, 1974 [FR] France .................................. 74 41086

[51] Int. Cl.² ............................................. H04M 1/50
[52] U.S. Cl. ............................................. 179/84 VF

[58] Field of Search ............ 179/16 R, 16 A, 16 AA, 179/84 SS, 84 VF, 87, 170 A, 1 P

[56] References Cited

U.S. PATENT DOCUMENTS

| | | | |
|---|---|---|---|
| 3,103,558 | 9/1963 | Ligotky | 179/84 VF |
| 3,582,565 | 6/1971 | Beeman et al. | 179/84 VF |
| 3,836,727 | 9/1974 | Hillekens | 179/84 VF |
| 4,092,499 | 5/1978 | Lofmark | 179/84 VF |

Primary Examiner—Thomas W. Brown
Assistant Examiner—Randall P. Myers
Attorney, Agent, or Firm—Kemon and Estabrook

[57] ABSTRACT

An apparatus comprising a stopband filter, a linear amplifier, a limiter circuit, a narrow band filter and a threshold circuit, insensitive to voice signals. When signalling signals are emitted with two frequencies, the apparatus comprises two channels each of them being protected by an input reject filter against one of the signalling frequencies.

3 Claims, 11 Drawing Figures

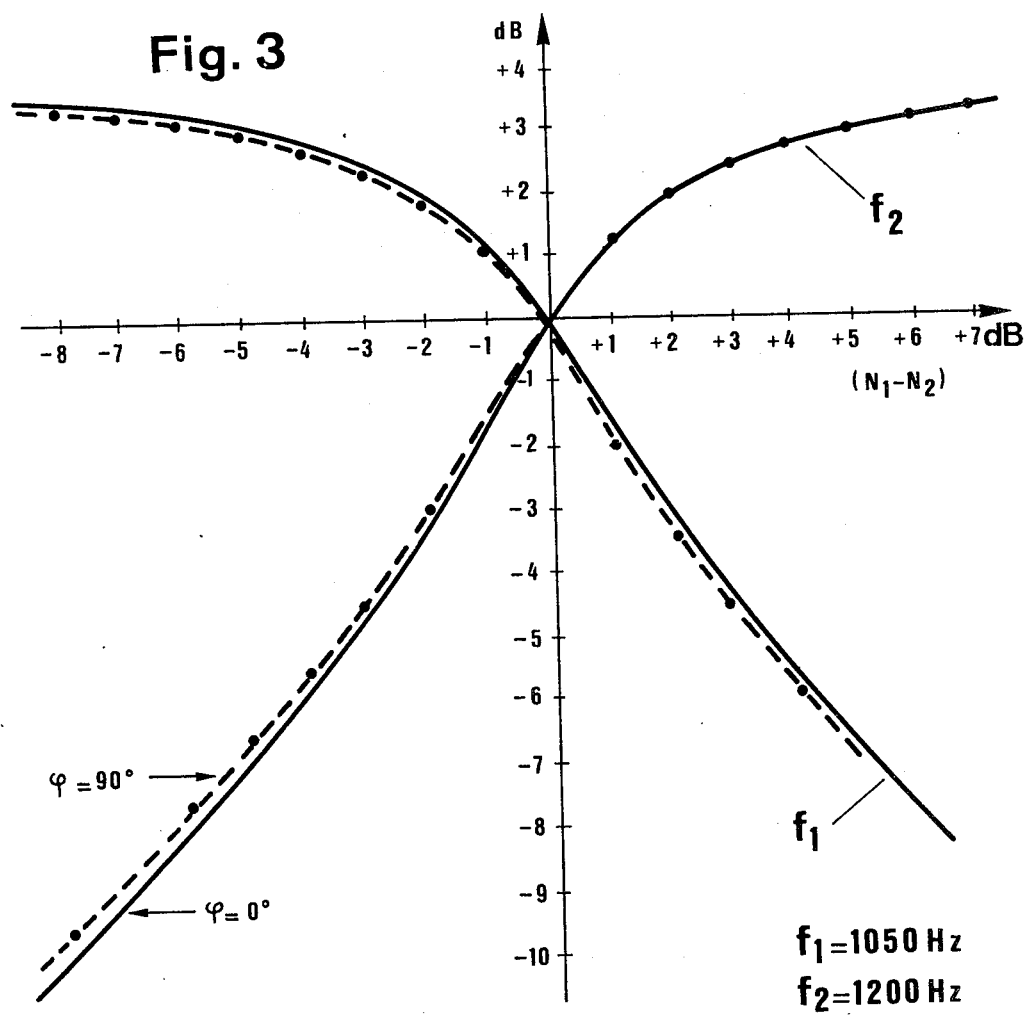
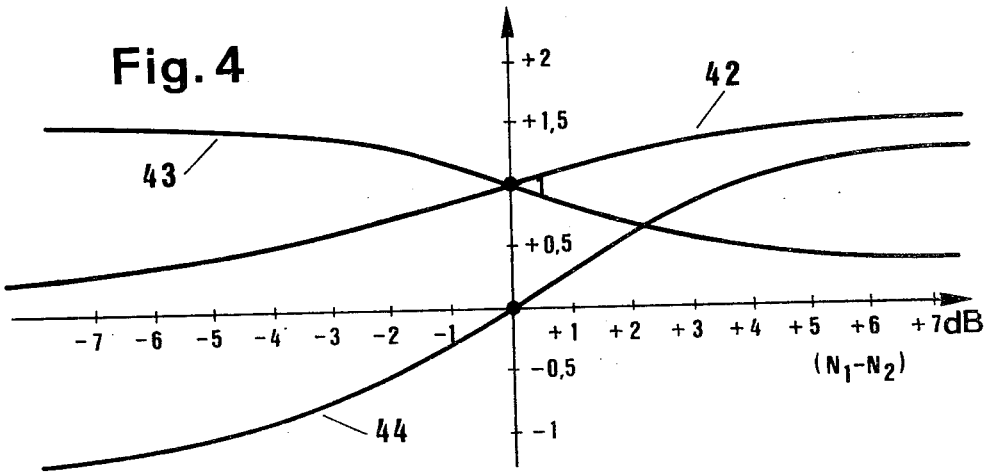

APPARATUS FOR DETECTING IN-BAND SIGNALLING SIGNALS

This is a continuation, of application Ser. No. 628,844, filed Nov. 4, 1975 now abandoned.

SUMMARY OF THE INVENTION

The present invention is based on the following discovery: when a limiter (or clipper) of threshold $S_0$ is fed simultaneously with two sinusoidal voltages of frequency $f_1$ and $f_2$, whereof the sum of the amplitudes $A_1+A_2$ is large with respect to $S_o$ and the ratio $f_1/f_2$ is an irreducible fraction the sum of the terms of which is large (above 10), the components of the output voltage at respectively $f_1$ and $f_2$ have amplitudes $A'_1$ and $A'_2$ exhibiting the following properties:

they are independent of the values of $f_1$ and $f_2$;
they are independent of the phase shift existing at the origin of the time between the two sinusoidal voltages applied to the limiter;
they are functions of the ratio $A_1/A_2$ within a wide range of values of the latter; therefrom results the fact that this is true also of their ratio $A'_1/A'_2$ and their difference $A'_1-A'_2$;
they are independent of $A_1$ and $A_2$ when the latter vary whilst preserving a constant ratio $A_1/A_2$;
the ratio $A'_1/A'_2$ is higher than the ratio $A_1/A_2$ when the latter is itself higher than unity and, on the contrary, the ratio $A'_1/A'_2$ is lower than the ratio $A_1/A_2$ when the latter is smaller than unity. This effect, which may be called "the expansion effect", is maximum when $A_1/A_2$ is close to unity.

From the properties mentioned hereinabove, it results that determination of the value of the ratio $A_1/A_2$ necessitates solely measurement of one of the magnitudes $A'_1$, $A'_2$ or $(A'_1-A'_2)$.

BACKGROUND OF THE INVENTION AND PRIOR ART

It is current practice, in particular in communication art, to refer to levels rather then amplitudes. In order to conform to this usage, the ratio $A_1/A_2$ will be replaced by the corresponding level variation $N_1-N_2$, at the same time pointing out that measurement of one of the amplitudes $A'_1$, $A'_2$ permits determination of the level shift $N_1-N_2$ and that the same applies to the difference in amplitudes $A'_1-A'_2$. After replacement of the amplitudes $A'_1$ and $A'_2$ by their respective level $n_1$, $n_2$, the previously mentioned expansion effect is rewritten as the fact that ratio $n_1-N_2/N_1-N_2$ which is higher than unity for $N_1>N_2$, adopts a maximum value when the level difference $N_1-N_2$ tends towards zero.

The said expansion effect may be utilized for the purpose of facilitating identification of one of the two sinusoidal voltages, or separation thereof. Furthermore, it is particularly favourable to the separation of two signals with slightly different amplitudes. Since there is no limitation concerning the relative values of frequencies $f_1$ and $f_2$, the process according to the invention affords a solution to the identification of a sinusoidal voltage under conditions wherein such could be made difficult on employing prior art means.

A particularly interesting use of the invention concerns telephone networks employing one or more voice frequency sinusoidal waves for signalling; the invention provides a circuit for the identification of the signalling against speech signals.

Since signalling and speech signals are transmitted successively through the same circuits, the presence in the speech signals of frequency components identical with those utilized for signalling makes it necessary to protect the signalling circuits against speech signals. This protection is generally obtained by means of a so-called guard circuit the introduction of which complicates the signal receiving equipment. The invention makes it possible to dispense with such a circuit.

Determining the ratio of the amplitudes of the two voltages according to the invention consists in applying the latter to the input of a limiter or clipping circuit of threshold value $S_0$ low relative to the sum of their amplitudes and, having isolated at least one of the components of the output signal of the same frequency as one of the said input voltages, in measuring the amplitude of this component.

A variant of the process comprises, having isolated the two components of the output signal having the same frequency as the said input voltages, measuring the shift of their amplitudes.

Identification means for signalling transmitted as a sinusoidal wave at voice frequency $f_1$, according to the present invention, comprises a circuit constituted by at least the following elements:

a stopband filter having maximum attenuation at frequency $f_1$;
a linear amplifier the input of which is connected to the output of the said selective network;
a limiter $S_0$ of low impedance relative to the output impedance of the amplifier, and connected to the latter;
a narrow bandwidth filter centred on frequency $f_1$ and the input of which is connected to the limiter output;
a threshold circuit the input of which is connected to the output of the said filter.

When the signalling is transmitted by means of two voice frequency waves $f_1$ and $f_2$, either simultaneously or not, the circuit for signalling identification comprises two channels separately processing the signals at frequencies $f_1$ and $f_2$.

The circuit for the identification of the communication signals according to the invention has the following advantages:

by principle, it guarantees its own protection without addition of a guard circuit;
it eliminates the action of the components relative to the signalling frequency and which may be contained in the voice signals, even if these components are intense, thereby making employment of a guard circuit useless,
the protection which it affords against voice signals is superior to that provided by a guard circuit, since its sensitivity depends only slightly on the amplitude range of the input signals,
its adaptation to the identification of signalling with two voice frequency signals (simultaneously or not) is very easy.

DETAILED DESCRIPTION OF THE INVENTION

The invention will be well understood on referring to the following description and to the figures accompanying the said description, which are given purely by way of illustrative and non limitative example and wherein:

FIG. 3 shows the curves of variation of the levels $n_1$ and $n_2$ of the components of frequencies 1050 and 1200 Hz in the output signal of a limiter as a function of the shifting of the levels $N_1$ and $N_2$ of the sinusoids at the input for a plurality of values of their relative phase at the instant $t=0$;

Figure 5:
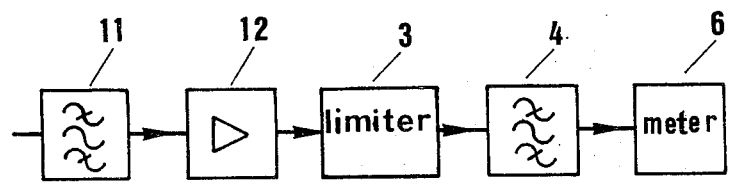
Figure 6:
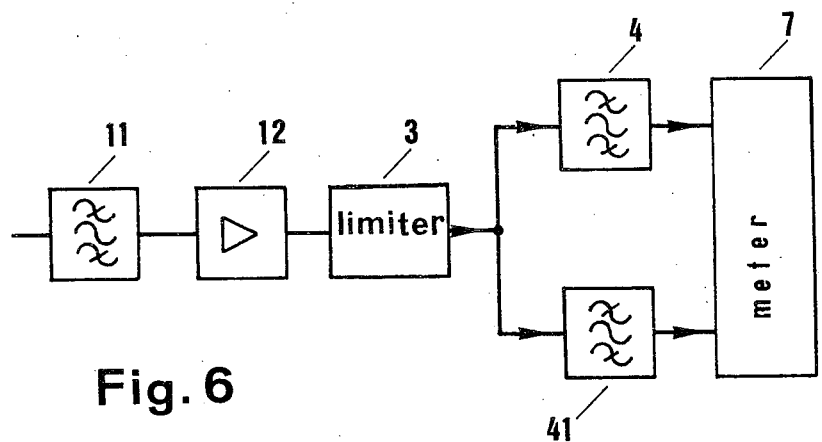
Figure 7:
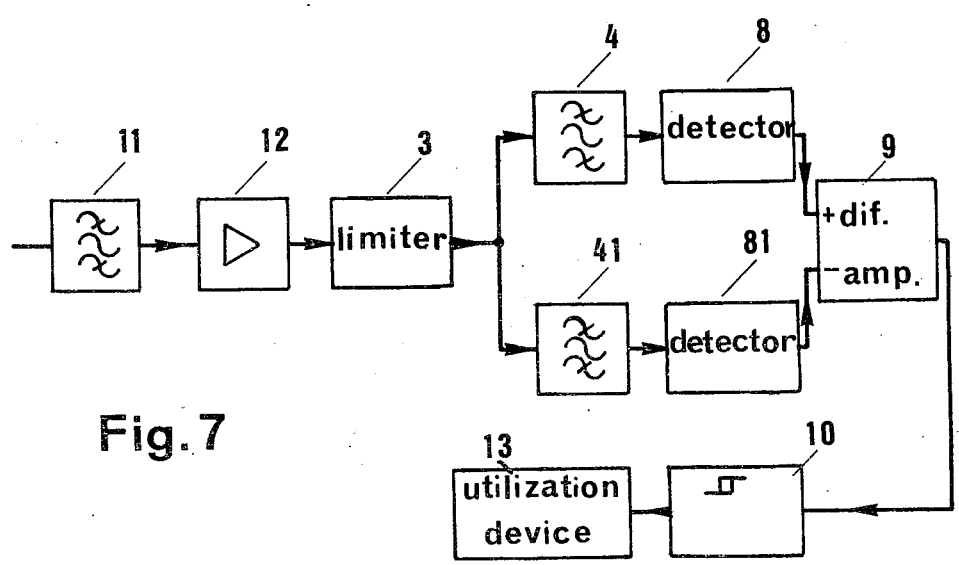
Figure 8:
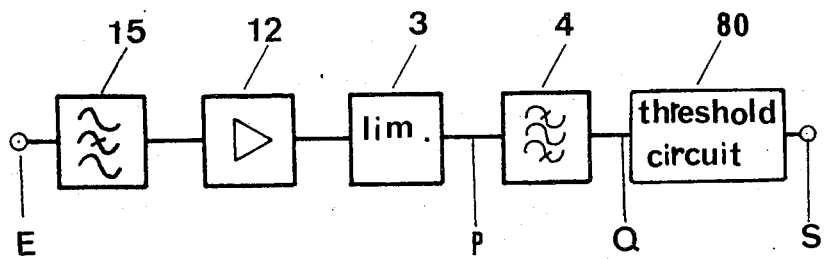
Figure 9:
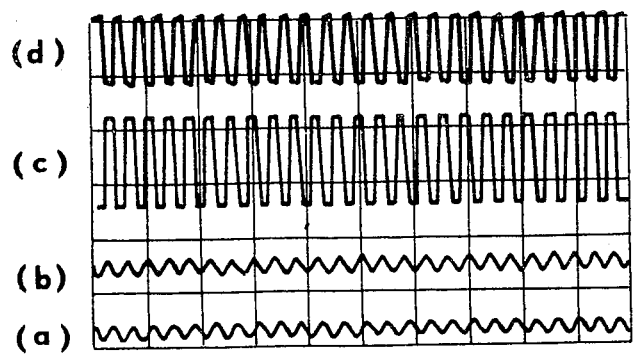
Figure 10:
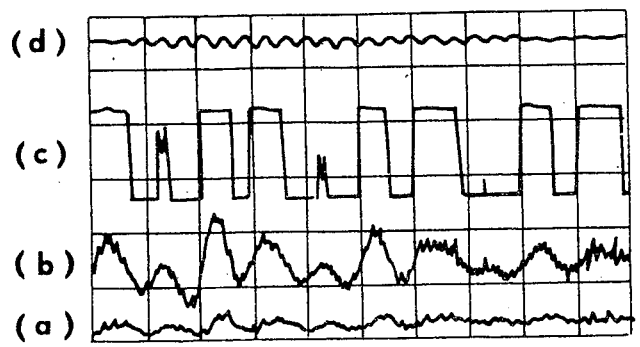
Figure 11:
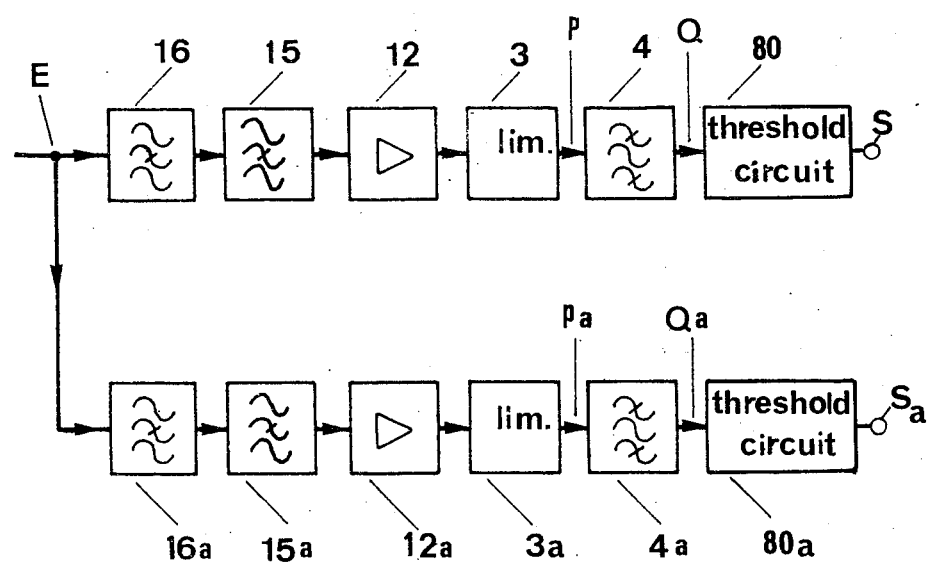

FIG. 4 shows the curves of variation of the reduced amplitudes $A'_1/A_0$ and $A'_2/A_0$ of the components of frequencies $f_1$ and $f_2$ in the output signal of a limiter as a function of the shifting of the levels $N_1-N_2$ of the sinusoidal voltages of frequency $f_1$ and $f_2$ introduced at the input and also the curve of variation of the difference of the reduced amplitudes $(A'_1-A'_2)/A_0$, $A_O$ being the common amplitude of the output waves at frequencies $f_1$ and $f_2$ when the inut amplitudes $A_1$ and $A_2$ are equal;

FIG. 5 shows the block diagram of a circuit according to the invention, utilizing measurement of the amplitude of a single output wave from the limiter having the same frequency as one of the two sinusoidal elements feeding the same;

FIG. 6 shows the block diagram of a circuit according to the invention, utilizing measurement of the difference of the amplitudes of the two output waves from the limiter having the same frequencies as the two sinusoidal input waves;

FIG. 7 shows a variant of the preceding Figure;

FIG. 8 shows the block diagram of a circuit for the identification of signalling signals transmitted by means of a single voice frequency wave according to the invention;

FIG. 9(a-d) shows recordings of the variation of the voltages at four points on the circuit according to FIG. 8;

FIG. 10(a-d) shows recording of the variation of the voltages at the same points on the circuit as those shown in the preceding figure, effected during reception of voice signals;

FIG. 11 shows the block diagram of a circuit for the identification of signalling signals transmitted by means of two voice frequency waves.

Figure 1:
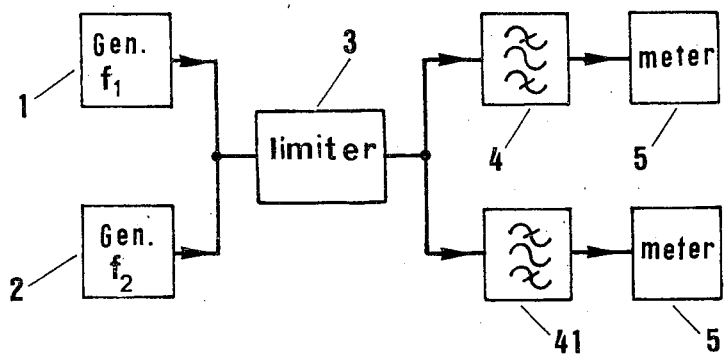
FIG. 1 shows the block diagram of the experimental set-up utilized for plotting the curves of FIG. 2.

FIG. 1 shows the block diagram of the experimental set-up used to establish the properties of a limiter serving as a basis to the invention. The diagram shows a first calibrated generator 1 supplying a known sinusoidal wave of frequency $f_1$ at a level $N_1$, a second calibrated generator 2 supplying a sinusoidal wave of frequency $f_2$ at a level $N_2$ and a limiter 3 comprising two diodes of type 1 N 914, commercially available from numerous manufacturers, and the threshold of which is 0.6 volt. The internal impedances of the generators 1 and 2 (of the order of 2 kilohms) are considerably higher than the impedance of the limiter network in the limiting operation. The output of the limiter 3 is connected to the inputs of two filters respectively 4 and 41. The bandwidth of filter 4 is 50 Hz on either side of frequency $f_1$, whereas that of filter 41 is 50 Hz on either side of frequency $f_2$. The output of each of the filters 4 and 41 is connected to the input of a decibel meter 5. The measurements have been effected at various frequencies $f_1$ and $f_2$ and the filters 4 and 41 were, on each occasion, tuned to the selected frequencies.

Figure 2:
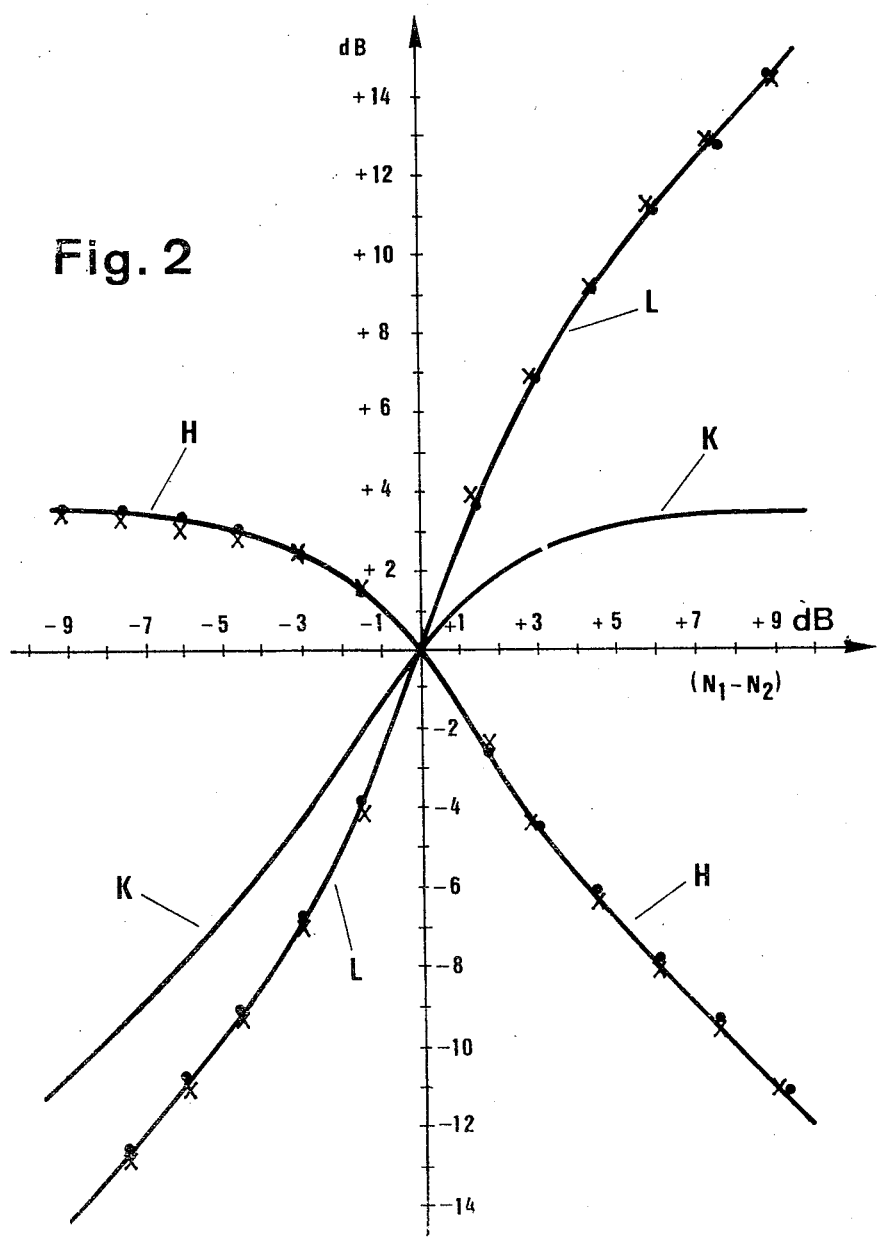
FIG. 2 shows the curves of variation of the levels $n_1$ and $n_2$ of the waves at frequency $f_1$ and $f_2$, measured at the output of an amplitude limiter as a function of the shift or difference of the levels $N_1-N_2$ of the input sinusoidal voltages at frequency $f_1$ and $f_2$ and also the curves of variation of $n_1-n_2$.

FIG. 2 shows the curves K and H of variation of the levels $n_1$ and $n_2$ of the output waves at frequencies $f_1$ and $f_2$ of the limiter fed with two sinusoidal waves at level $N_1$ and $N_2$ respectively, as a function of the level difference $N_1-N_2$. The reference level for the output waves is the common level $n_0$ when their level difference $n_1-n_2$ is zero. Curve L in FIG. 2 shows the curve of variation of the difference of the levels $n_1-n_2$ as a function of $N_1-N_2$. These curves were experimentally established by means of the circuit shown in FIG. 1, giving to level $N_1$, successively, the values +15 and +25 dB, and varying for each one of these values the difference $N_1-N_2$ between minus 9 and plus 9 dB. The levels $N_1$ and $N_2$ are measured relative to a preset reference value, in this example equal to that standardized in telephony.

The results of these measurements are shown in tables I and II.

TABLE I

| | $N_1 = +15$ dB | | | |
|---|---|---|---|---|
| $N_2$ dB | $N_1-N_2$ dB | $n_1$ dB | $n_2$ dB | $n_1-n_2$ dB |
| + 6 | + 9 | + 3.6 | − 10.7 | + 14.3 |
| + 7.5 | + 7.5 | + 3.5 | − 9.2 | + 12.7 |
| + 9 | + 6 | 3.3 | − 7.5 | + 10.8 |
| + 10.5 | + 4.5 | 3 | − 5.9 | + 8.9 |
| + 12 | + 3 | 2.6 | − 4.1 | + 6.7 |
| + 13.5 | + 1.5 | 1.6 | − 2.1 | + 3.7 |
| + 15 | 0 | 0 | 0 | 0 |
| + 16.5 | − 1.5 | − 2.2 | + 1.7 | − 3.9 |
| + 18 | − 3 | − 4.4 | + 2.6 | − 7.0 |
| + 19.5 | − 4.5 | − 6.1 | + 3.1 | − 9.2 |
| + 21 | − 6 | − 7.8 | + 3.4 | − 11.2 |
| + 22.5 | − 7.5 | − 9.2 | + 3.6 | − 12.8 |
| + 24 | − 9 | − 10.8 | + 3.7 | − 14.5 |

TABLE II

| | $N_1 = +25$ dB | | | |
|---|---|---|---|---|
| $N_2$ dB | $N_1-N_2$ dB | $n_1$ dB | $n_2$ dB | $n_1-n_2$ dB |
| + 16 | + 9 | + 3.6 | − 11 | + 14.6 |
| + 17.5 | + 7.5 | 3.5 | − 9.4 | + 12.9 |
| + 19 | + 6 | 3.3 | − 7.9 | + 11.2 |
| + 20.5 | + 4.5 | 3 | − 6.2 | + 9.2 |
| + 22 | + 3 | 2.6 | − 4.4 | + 7.0 |
| + 23.5 | + 1.5 | 1.9 | − 2.5 | + 4.4 |
| + 25 | 0 | 0 | 0 | 0 |
| + 26.5 | − 1.5 | − 2.5 | + 1.8 | − 4.3 |
| + 28 | − 3 | − 4.5 | + 2.5 | − 7.0 |
| + 29.5 | − 4.5 | − 6.3 | + 2.9 | − 9.2 |
| + 31 | − 6 | − 7.9 | + 3.2 | − 11.1 |
| + 32.5 | − 7.5 | − 9.3 | + 3.4 | − 12.7 |
| + 34 | − 9 | − 10.9 | + 3.5 | − 14.4 |

Tables I and II correspond to measurements carried on at $f_1$ and $f_2$ equal respectively to 1700 and 2100 Hz. Other measurements carried on at different frequencies such as for example 1200 and 1310 Hz give experimental points located on the same curves. Experiment shows that the curves shown in FIG. 2 do not depend on the absolute value of the frequencies $f_1$ and $f_2$ provided that the ratio $f_1/f_2$ is equivalent to a non-reducible fraction no term of which is equal to one and the sum of the two terms of which is higher than 20, to approch ideal conditions wherein the ratio $f_1/f_2$ would be irrational.

FIG. 3 shows how the variation curves $n_1$ and $n_2$ are modified as a function of the relative phase of the two input signals at the time origin, when the sum of the two terms of the fraction $f_1/f_2$ previously made irreducible has a value equal to 15. The values of the frequencies selected for this measurement are respectively $f_1=1050$ Hz and $f_2=1200$ Hz so that $f_1/f_2=\frac{7}{8}$. Calling "phi" the phase shift at the time origin between the sine waves fed in the limiter, there is found a difference in the plotted curves when "phi" passes from 0 to 90°. This divergence increases when the sum of the terms of the irreducible fraction $f_1/f_2$ diminishes and, on the contrary, becomes negligibly small when the said sum is at least equal to 20. This value is the limit commencing from which the amplitudes $A'_1$ and $A'_2$ of the ouput signal of the limiter may be considered, from the practical viewpoint, as bijective functions of the level difference $N_1-N_2$. However, for certain applications, it is possible to utilize a value of the said sum comprised between 5 and 20 and it is then necessary to test the response of the limiter as a function of the level difference of the input signals and of the phase shift phi, and to establish whether the amplitudes $A'_1$ and $A'_2$ of the waves of frequency $f_1$ and $f_2$ of the output signal meet the requirement of the output circuit specially when it incorporates a threshold circuit. When the circuit operates on the difference $A'_1-A'_2$, it is for example possible to utilize a double threshold circuit and to set the thresholds on either side of the zone of the curve of variation $A'_1-A'_2$ as a function of the level difference $N_1-N_2$ sensitive to the value of phi to eliminate these parts of the variations. It is then possible to operate on waves with frequencies $f_1$ and $f_2$ the sum of which is in the interval ranging from 5 to 20. In this case, care is taken to maintain the operation within the limits set by the two thresholds since freedom from the phase shift phi is only to be obtained within said limits.

It is quite clear that the other limitations of the values permitted for the frequencies $f_1$ and $f_2$ may come from the design of the limiter. Semiconductor diodes allow designing limiters which deliver curves such as shown in FIG. 2 up to their cut-off frequency, whereas operational amplifiers with a bandwidth limited to a few kHz will limit the correct operation of the limiter to frequencies within the bandwidth.

The decibel meters 5 shown in FIG. 1 may obviously be substituted by two identical electronic peak voltmeters. The input of the first is connected to the output of the filter 4 and the input of the second to the output of the filter 41. The readings of the said voltmeters are $A'_1$ and $A'_2$. With the aid of the reading $A_0$ which is the common value when the level difference $N_1-N_2$ is zero, the ratios $A'_1/A_0$ and $A'_2/A_0$ may be formed. The first ratio $A'_1/A_0$ varies as a function of the value of the level difference $N_1-N_2$ in accordance with the curve 42 of FIG. 4 and the second ratio $A'_2/A_0$ varies in accordance with curve 43. These curves are identical with those which may be deduced from curves K and H in FIG. 2 by logarithmic transformation. FIG. 4 shows, furthermore, the curve 44 of variation of the difference of the ratios $(A'_1/A_0)-(A'_2/A_0)$ as a function of the level difference $N_1-N_2$. Curve 44 may be deduced from curve L of FIG. 2 through the same logarithmic transformation.

The measurements have shown that the amplitudes $A'_1$ and $A'_2$ vary as a function of the ratio $(A_1+A_2)/S_0$ and tend towards a limit value which may be considered from the practical viewpoint as having been reached as soon as the sum of the amplitudes $(A_1+A_2)$ is at least equal to 10 $S_0$.

Tests have been carried on with a set-up comprising a limiter the output of which is connected by a filtering network transmitting solely the components of frequency $f_1$ and $f_2$ to the input of a linear amplifier the output of which is connected to the input of a second limiter identical with the first. The results show that it is possible to increase the slope of the curves, for example levels or shifts of the output levels of the components of frequency $f_1$ and $f_2$ measured at the output of the second limiter as a function of the shift of the input wave levels. The utilization of two limiters connected in series requires that the total power of the noise introduced with the sine waves at $f_1$ and $f_2$ at the input of the first limiter be negligible relative to the power corresponding to the said sine waves. This two stage limiter may be interesting in specific applications.

FIG. 5 shows the block diagram of a circuit according to the invention to determine the difference in level of two sinusoidal voltages of frequencies $f_1$ and $f_2$. This comparator comprises:

a filter 11 permitting passage without attenuation of a frequency band containing $f_1$ and $f_2$;

a linear amplifier 12 the input of which is connected to the output of the filter 11;

a limiter the input impedance of which is low relative to the output impedance of the said amplifier and the input of which is connected to the output of the latter;

a narrow bandwidth filter 4 tuned to one of the frequencies $f_1$ or $f_2$ and connected to the output of the limiter 3;

an electronic peak voltmeter 6.

By way of illustration and purely without limitation a circuit of this type has been designed to operate at frequency values $f_1=1700$ Hz and $f_2=2100$ Hz. The filter 11 has a bandwidth covering at least the band from 1600 to 2200 Hz. The output impedance of amplifier 12 is 2000 ohms and its gain is 1000. The limiter 3 is identical with that in FIG. 1.

When the sum of the amplitudes of the sine waves at 1700 and 2100 Hz applied to the input of the filter 11 attains at least 6 millivolts, the output voltage supplied by the limiter 3 depends only on the difference $N_1-N_2$ of the input levels of the two waves and it is possible with the aid of the curve 42 of FIG. 4 to graduate voltmeter 6 in input level shifts $N_1-N_2$.

A variant of the circuit consists in replacing the peak voltmeter 6 by a rectifier the output of which is connected to the input of a threshold circuit $S'_0$ the output of which is, itself, connected to the input of an utilization circuit, in such manner that any value of the rectified signal in excess of the threshold $S'_0$ actuates the said utilization circuit.

FIG. 6 shows a variant of the preceding circuit comprising: a narrow bandwidth filter 4 tuned to one of the frequencies $f_1$ for example and a second filter 41 tuned to $f_2$ and whereof the input is connected to the output of the limiter 3 in parallel with that of the filter 4; a differential measurement device 7, the two inputs of which are connected respectively to the output of the filters 4 and 41. The measurement apparatus 7 comprises two identical detection and filtering circuits connected respectively by their input to the inputs of the said measurement device and by their output respectively to the two inputs of a differential amplifier the output of which is connected to a voltmeter.

By way of entirely non-limitative illustration, a circuit of this type operating at the same frequencies as mentioned in reference to FIG. 5 was designed incorporating the filter 11, the amplifier 12, the limiter 3 and the filter 4 identical with those of the FIG. 5. The bandwidth of the filter 41 is 50 Hz on either side of the frequency 2100 Hz. The filtered waves feed the two inputs of the differential measurement device 7. The voltmeter displays the amplitude difference $A'_1-A'_2$. The curve 44 sets the correspondence between the reading of the measurement apparatus 7 and the value of the level difference $N_1-N_2$. It may also serve for graduating the measurement device 7 directly in values of the difference of level $N_1-N_2$ at the input of the limiter, the latter being the same as the difference in level of the two sine voltages introduced at the comparator input.

FIG. 7 shows a variant of FIG. 6 comprising like the latter, a filter 11 and amplifier 12, a limiter 3 the output of which is fed to the input of a filter 4 and to the input of a filter 41 identical with the elements already designated by these reference numerals. The output of the filter 4 is connected to the input of a detection and filtering assembly 8 the output of which is connected to the direct input of a differential amplifier 9. The output of the filter 41 is connected to the input of a detection and filtering assembly 81 identical with the assembly 8 and whereof the output is connected to the inverted input of the differential amplifier 9. The output of the amplifier 9 is connected to the input of a two threshold circuit 10 the output of which is connected to an utilization device 13.

By way of non-limitative illustration, a circuit of this type operating at frequencies $f_1 = 1700$ Hz and $f_2 = 2100$ Hz has been designed with detection and filtering circuits 8 and 81 consisting of a bridge of diodes associated with a low-pass RC filter.

The operation of the circuit shown in FIG. 5 is as follows: a signal containing waves at frequencies $f_1$ and $f_2$ with an energy at least equal to ten times that existing in the remainder of the spectrum is introduced at the input of the filter 11. The output signal of the amplifier 12 occupies the frequency spectrum limited to the bandwidth of the filter 11. Since the amplifier 12 is linear, the energy corresponding to frequencies $f_1$ and $f_2$ in this signal is at least equal to ten times that existing in the remainder of the remaining spectrum. The amplitudes $a_1$ and $a_2$ of the components at frequencies $f_1$ and $f_2$ present in the signal introduced at the input of the filter 11 become $A_1$ and $A_2$ after amplification. If the values $a_1$ and $a_2$ are of an order of magnitude suitable to produce the result that the sum $A_1 + A_2$ is at least equal to ten times the value of the threshold $S_0$ of limiter 3, the amplitudes $A'_1$ and $A'_2$ of the waves at $f_1$ and $f_2$ in the output signal of the limiter depend only on the difference of the levels $N_1 - N_2$ (corresponding to $A_1/A_2$ is also the ratio $a_1/a_2$). On the contrary, if the signal introduced at the input of the filter 11, excluding $f_1$ and $f_2$, exhibits increasing energy, it has been found that the limiter output signal includes possible combinations of the component of frequency $f_1$ with the components of the other frequencies of the spectrum, subsisting after passage through the filter 11, contribute to reduce the amplitude $A'_1$ of the wave at $f_1$ and the same applies to the frequency $f_2$ in such manner that $A'_2$ is also reduced. For this reason, when the frequencies $f_1$ and $f_2$ are distant, in order to prevent the use of a large bandwidth filter, it is preferable to use two separated narrow bandwidth filters tuned respectively at the values of $f_1$ and $f_2$.

Returning to the case where the signal introduced at the input of the limiter 3 has its energy concentrated almost exclusively in the frequencies $f_1$ and $f_2$, it will be noted that the filter 4, the narrow bandwidth of which is tuned about the frequency $f_1$ for example, transmits the component $f_1$ to the input of the peak voltmeter 6 after having isolated it from the frequency spectrum of the signal emerging from the limiter 3. The indication provided by the peak voltmeter 6 is thus $A'_1$. Utilization of the curve 42 of FIG. 4 necessitates reading of the value $A_0$ indicated by the peak voltmeter when $A_1 = A_2$, so as to form for each reading of the voltmeter the ratio $A'_1/A_0$ to be plotted on curve 42 in order to obtain the difference of level $N_1-N_2$ of the waves at $f_1$ and $f_2$. It is self-evident that the curve 42 also permits graduation of the peak voltmeter 6 directly in values of the level shift $N_1-N_2$ as well as in values of $A_1/A_2$.

In the circuit shown in FIG. 6 the two components of frequencies $f_1$ and $f_2$ present in the output signal of the limiter are used. The differential measurement device 7, after detection of the said components, forms the difference of their amplitudes $A'_1-A'_2$ and amplifies it in such manner that the reading of the measurement apparatus 7 is proportional to $(A'_1-A'_2)$. Utilization of the curve 44 in FIG. 4 representing $(A'_1-A'_2)/A_o$ necessitates determination of the reading $A_0$ corresponding to the case wherein the two sine waves introduced at the input of the circuit represented in FIG. 6 have the same level. The determination of $A_0$ is effected as previously by introducing at the input of the circuit shown in FIG. 6 two sinusoidal signals the amplitudes $a_1$ and $a_2$ of which are equal and by short-circuiting one of the two inputs of the measurement device 7. After removing the short circuit, each reading of the measurement device 7 may be handled to establish the ratio $(A'_1-A'_2)/A_0$ whereby the curve 44 gives the value of the corresponding input level difference $(N_1-N_2)$, and it is obvious that the curve 44 permits graduation of the measurement device 7 in values of input level difference $N_1-N_2$.

The circuit shown in FIG. 7 in the output voltage of the differential amplifier 9 is supplied to the input of a circuit 10 of the two-threshold Schmitt trigger (flip-flop) type. Consequently, when the input level difference $(N_1-N_2)$ passes through two particular values $N_0$ and $N'_0$, circuit 10 is triggered. It is possible to control the operation of an utilization circuit (such as an alarm, a pilot lamp, etc...) when the difference level $N_1-N_2$ leaves an interval set by the limits $N_0$ and $N'_0$.

FIG. 8 shows a circuit according to the invention designed for identification of a.c. signalling at frequency $f_1$. The input E is connected to a selective network 15 the maximum attenuation $N_0$ of which ranging between 10 and 14 decibels is obtained at the signalling frequency $f_1$. The output of the network 15 is connected to the input of a linear amplifier 12. The output of the said amplifier has an impedance substantially higher than that of a limiter 3 to the input of which it is connected. The output p of the limiter 3 is connected to the input of a narrow bandwidth filter 4 centred on frequency $f_1$. The output Q of the filter 4 is connected to the input of a circuit 80 of threshold $S'_0$ lower than the threshold $S_0$ of the limiter 4. The output of the circuit 80 is connected to the output S.

The operation of the circuit is as follows.

The input E receives signalling signals constituted by elementary signals each comprising a pulse during which a sine wave at frequency $f_1$ is emitted and a period of silience following thereon. The frequency spectrum of such a signal comprises a component at the fundamental frequency $f_1$ and couples of harmonics disposed symmetrically relative to that of the said fundamental and whereof the amplitudes decrease in proportion as the rank of the harmonic increases. The relationships of amplitude and phase existing between the components of the spectrum result from the shape of the pulse and its duration.

The stopband filter 15 has an attenuated band centered on the frequency $f_1$ of sufficient bandwidth to transmit a number of components of the spectrum close to the fundamental (whilst respecting their reciprocal relationships as to amplitude and phase) sufficient to introduce a low distortion of attenuation in the output signal. This result is, in practice, achieved when the attenuated band (at 3 dB) extends on either side of the frequency $f_1$ over a width at least equal to ten times the maximum recurrence frequency of the signalling pulses. Linear amplifier 12 also keeps the amplitude and phase relationships of the components of the signalling signals. Under these conditions, the signals introduced at the input of the limiter 3 preserve substantially the shape of the signals supplied to the input E, in particular the sides of the pulses which constitute them have undergone only negligible deformation.

Furthermore, if the amplitude of a sinusoidal wave of frequency $f_1$ introduced at the input of the limiter 3 is substantially higher than the limiting voltage $S_0$, the limited output wave spectrum comprises a sine wave of amplitude $S_0 4/\pi$ at frequency $f_1$ and harmonic waves the frequencies of which are odd multiples of $f_1$ and the amplitudes of which are given by the expression $S_0 4/(2n+1)\pi$ when n describes the set of the positive integers. These harmonic waves are eliminated by the pass-band filter 4 following the limiter 3.

If the amplitude of a sine wave of frequency $f_1$ introduced at the input of the limiter 3 is lower than or at most equal to the limiting voltage $S_0$, the output wave is identical with the input wave.

Thus, the maximum attenuation $N_0$ of the stopband filter 15, the gain of the amplifier 12 and the threshold $S_0$ of the limiter 3 are selected in such manner that, at the minimum reception level of the signalling signals defined by standards, there correspond at the input of the limiter 3 signals with an amplitude $S_0$. The order in which the network 15 and the amplifier 12 follow each other may be reversed without substantially altering the mode of operation of the circuit for identification of the signalling signals according to the invention, provided that the impedances are matched. Consequently, when input E receives signalling signals there appear, at the output of the limiter 3 during the intervals of time during which the input signals are emitted, signals with an amplitude $S_0$ the spectrum of which comprises a sine wave at $f_1$ the amplitude of which is comprised between the value $S_0$ and the maximum value $S_0 4/\pi$ (the level of which is higher by 2.1 decibels than the level no of $S_0$). The limiter 3 introduces a compression of the output level difference, exhibiting the advantage that it permits operating any following circuit at almost constant level.

When the input B receives voice or noise signals, the composite spectrum comprises numerous components having random frequencies, amplitudes and phases, and they are of variable duration, as described on pages 14 to 63 of chapter II of the book entitled "Speech and Hearing" by Fletcher, published by Editions Van Nostrand in 1929. The degree of probability that an input signal will comprise a sine wave within the bandwidth of the filter 4 and the level of which is higher than the operating threshold of the identification circuit and the duration of which may be assimilated to that of a signalling signal is practically zero, since it is possile to design filter 4 with a narrow bandwidth without disturbing the operation of the signalling circuits following the identification circuit. In fact, as will be clear from the foregoing, the limiter 3 maintains between $n_0$ and $n_0+2.1$ dB the level of the sine component of frequency $f_1$ of the signals which it transmits in reply to the signalling signals. The bandwidth of the filter 4 which limits the number of components having frequencies close to $f_1$ defines the minimum rise and decrease time of the pulses transmitted in response to the signalling signals. Its width is just sufficient to maintain the response time of the signalling relay set at a level lower than the limit value defined by the standards. This result is achieved when the bandwidth at 3 dB of the filter 4 has a width at least equal to eight times the maximum signalling recurrence frequency, possibly increased by the tolerated shift on frequency $f_1$ said bandwidth being centered at $f_1$.

A sine wave of frequency f outside to the bandwidth of the filter 4 is eliminated; however, when the frequency f is lower than the frequency $f_1$, harmonic waves created by the limiter 3 may be comprised within the bandwidth of the filter 4. As already stated in the foregoing, these waves are harmonics of odd order and their amplitude is given by the expression $S_0 4/(2n+1)\pi$. The frequency $f_1$ being, for example, higher than 1 kHz the frequencies f comprised between $f_1/3 - \Delta/3$ and $f_1/3 + \Delta/3$ (with $\Delta$ equal to the bandwidth of the filter 4) belong to the voice band and produce at the output of the limiter 3 waves the frequency of which is included within the bandwidth of the filter 4 and the maximum amplitude $S_0 4/3\pi$ of which corresponds to a level 9.5 decibel below the maximum level of that of the component at the fundamental frequency $f_1$ or 7.4 decibels below the limiting level $n_0$; thus, it is possible to fix the level $n'_0$ of the threshold of the circuit 8 at a value comprised between $n_0$ and $n_0 - 7.4$ dB and remove these components.

A composite signal introduced at the input E comprising two components of different frequency (whereof one is $f_1$ and the other $f_2$) of respective levels $N_1$ and $N_2$ will appear at the output of the limiter as a sine wave of frequency $f_1$ having an output level lower than $n_0$ if the difference of level $N_1-N_2$ is negative (as indicated by curve K in FIG. 2) and this level is lower than $n_0 - 7.4$ dB when the shift $N_1-N_2$ is lower than $-5.5$ dB. It is the object of stopband filter 15 to lower the level of the input component at frequency $f_1$ relative to that of the input component at frequency $f_2$ by a quantity $N_0$ such that the difference in levels at the input of the limiter is always lower than $-5.5$ dB as is the case when the attenuation $N_0$ is comprised between 10 and 14 dB.

A composite signal comprising a plurality of components of frequencies other than $f_1$ introduced at the input E produces at the output of the limiter 3 a wave of frequency $f_1$ the amplitude of which is lower than the preceding one (as stated hereinabove).

To sum up, the signalling signals give as an output signal from filter 4 a wave at frequency $f_1$ with a level at least equal to the limiting level $n_0$. A sine wave of frequency comprised between $f_1/3 - \Delta/3$ and $f_1/3 + \Delta/3$ introduced at the input of the identification circuit produces at the output of filter 4 the signal of maximum level, and this level is at most equal to $n_o - 7.4$ decibels. Thus, the level $n'_0$ of the threshold $S'_0$ of the circuit 8 is set between 3 and 4 decibles below the limiting level $n_0$ in order that it may be substantially in the centre of the difference defined hereinabove.

A circuit for the identification of signalling signals according to the invention has been designed as described hereinabove with following data:

the frequency $f_1$ is equal to 1200 Hz;

the maximum frequency of recurrence of the signals $f_0$ equal to 10 Hz according to CCITT recommendations;

the attenuation $N_0$ of selective network 15 is equal to 12 decibels at 1200 Hz;

the 3 dB bandwidth of the selective network 15 is 200 Hz;

the amplifier 3, of integrated type, is commercially available from numerous manufacturers under the reference $\mu$ A 741, its gain is set to 50 dB;

limiter 3 consists of two diodes 1N914 the threshold of which is close to 0.6 volts;

filter 4 has a 3 dB bandwidth equal to 90 Hz centered on 1200 Hz;

the threshold circuit 8 consists of a pair of Zener diodes of type BZ 788 commercially available from numerous manufacturuers, the threshold voltage is set to 5.6 volts.

FIG. 9 is a record of the signals at different points of circuit shown in FIG. 8 made on a CRT with a sweep of 0.5 frames per millisecond;

curve a shows the sine voltage at the signalling frequency $f_1 = 1200$ Hz of constant amplitude equal to the nominal value set by the CCITT applied at the input E;

b shows the variation of the output voltage of the stopband filter 15;

c shows the variation of the voltage of point P in FIG. 8 (output from limiter 3);

d shows the variation of the voltage at point Q (output from filter 4).

This latter voltage is of sine shape when its amlitude is lower than the threshold $S'_0$ of the circuit 8 and, on the contrary, it is of rectangular shape when it reaches the value $S'_0$.

The recording d shows that a sine wave of constant amplitude and the level of which is higher than the minimum signalling level introduced at the input E of the identification circuit produces at the input of the circuit 8 an alternating voltage the amplitude of which is slightly higher than $S'_o$; therefore output signals appear at the output S of the circuit 8.

Due to the fact that $f_0$ is low relative of $f_1$, it is clear that the chopping of a sine wave at 1200 Hz at a fundamental frequency $f_0$ of 10 Hz produces at the input of 8 a signal constituted by a sine wave at 1200 Hz clipped to the value $S_0$ during the pulses when the wave at 1200 Hz is transmitted.

FIG. 10 shows, recorded under the same conditions as heretofore:

curve a, a voice signal introduced at the input E of the identification circuit during the reading of a text;

b and c respectively, the same voltages as in the curves b and c of FIG. 9;

d, the variation of the voltage of point Q of FIG. 8.

This latter voltage has an amplitude lower than that of the threshold $S'_0$ and is not clipped. Thus, no signal is supplied to the output S of circuit 8.

FIG. 11 shows the block diagram of a circuit for the signalling identification corresponding to signalling by means of two voice frequency signalling respectively at $f_1$ and $f_2$. The input E of the circuit shown is connected on the one hand to a band rejection filter 16 the attenuation of which is maximum at frequency $f_2$ and which feeds circuits 15, 12, 80a, 4, 8 identical with those of FIG. 8 and, on the other hand, to the input of a band rejection filter 16a the attenuation of which is maximum at frequency $f_1$ and which feeds circuits 15a, 12a, 3a, 4a and 8a, connected to each other in the same manner circuits 15 to 8 in FIG. 8 wherein:

15a is a stopband filter the attenuation of which of maximum value $N_o$ takes place at frequency $f_2$;

12a is an amplifier identical with the amplifier 12;

3a is a limited identical with the limiter 3;

4a is a narrow bandwidth filter centred on frequency $f_2$;

8a is a circuit identical with 80a.

The mode of operation of the identification circuit shown in FIG. 11 is as follows: the filters 16 and 16a have a value of attenuation at least equal to 30 decibels and each eliminates a narrow band of frequencies centred respectively on $f_2$ and $f_1$. Therefore, channel 16–80 will process the wave at $f_1$ and channel 16a to 80a the wave at $f_2$ as already explained with reference to FIG. 8 and supplies signalling signals at the associated output S and $S_a$.

A circuit for the identification of signalling signals transmitted by means of two voice frequency waves has been designed operating at $f_1 = 1200$ Hz and $f_2 = 1600$ Hz. The operation of the circuit imposes no limitations with regard to the choice of the values of $f_1$ and $f_2$. This circuit has the following characteristics:

filter 16 exhibits maximum attenuation of 40 decibels at 1600 Hz;

the filter 16a exhibits maximum attenuation of 40 decibels at 1200 Hz;

the stopband filter 15a exhibits attenuation of 12 dB at frequency 1600 Hz and its 3 dB bandwidth is equal to 200 Hz;

the filter 4a exhibits a 3 dB bandwidth equal to 90 Hz and which is centered on the frequency 1600 Hz;

the stopband filter 15 and the filter 4 have already been described with reference to FIG. 8.

It is possible, without altering the operation of the identification circuit, to replace the filter 16 and the stopband filter 15 by a single filter, provided that the latter exhibits about frequencies $f_2$ and $f_1$ an attenuation substantially equal respectively to the two circuits 16 and 15. Experiment has shown that the slight degree of dissymmetry of the attenuation curve substituted for that of the stopband filter 15 does not in any way impair functioning of this circuit. Similarly, filter 16a and stopband filter 15a may, without disadvantage, be replaced by a single filter. A single filter design reduces cost. As an example, filter 16 and stopband filter 15 have been replaced, in the preceding embodiment, by a filter of quadripole form constituted by two resistors R each equal to 3300 ohms, connected in series between a first input and a first output of a filter and an inductor of 70 millihenrys connected in series with a capacitor equal to 0.127 microfarad, and disposed between the point common to the resistors R and a conductor interconnecting the second input with the second output. The results where identical with those shown in FIGS. 9 and 10.

What we claim:

1. In a telephone system, a circuit for identification of pulsed signalling signals received at level $n_L$ said signals at least consisting of a wave at a frequency $f_1$ within the speech frequency band modulated by means of recurrent pulses with a variable recurrence frequency comprising:

an input rejection filter with a maximum attenuation N set at $f_1$ and a 3 dB bandwidth at least equal to twenty times the maximum recurrence frequency of the signalling pulses;

a linear amplifier with a constant gain equal to G decibels having its input connected to the output of said rejection filter;

a limiter circuit limiting the output signal from said amplifier at an amplitude $S_0$ corresponding to a level $n_0$ equal to $n_L - N + G$;

a narrow band filter tuned at said frequency $f_1$ connected to the output of said limiter circuit; and a threshold circuit connected to the output of said narrow band filter with a threshold value $S'_0$; such that $n_0 - 7.4$ dB $< S'_0 < n_0$ for protection against speech signals.

2. A circuit according to claim 1 wherein the attenuation of N of said input reject filter is between 10 and 15 dB.

3. In a telephone system in which signalling signals are composed of two waves of respective frequencies $f_1$ and $f_2$ within the speech frequency band modulated by means of variable frequency recurrent pulses at a level at least equal to $n_L$, an identification circuit including a first elementary circuit in a first path for identifying frequency $f_1$ and a second elementary circuit in a second path for identifying frequency $f_2$, each elementary circuit comprising:

a stopband filter with maximum attenuation N;

a linear amplifier with a gain equal to G decibels;

a limiter circuit with a maximum output of amplitude $S_0$ corresponding to a level $n_0$ equal to $n_L - N + G$;

a narrow band filter;

a threshold circuit with a threshold value $S'_0$ corresponding to a level $n'_0$ such that $n_0 - 7.4$ db $< S'_0 < n_0$;

the filters of said first elementary circuit being tuned at frequency $f_1$ and those of said second elementary circuit being tuned at frequency $f_2$; and a 30 db reject filter tuned at frequency $f_2$ for said first elementary circuit and at $f_1$ for said second elementary circuit, respectively, connected between the input of said identification circuit and the input of said elementary circuit; and stopband filter.

* * * * *